(12) United States Patent
Roark et al.

(10) Patent No.: US 11,832,400 B2
(45) Date of Patent: Nov. 28, 2023

(54) RUGGEDIZED PROGRAMMABLE POWER SWITCH

(71) Applicant: TERRA FERMA, LLC, Colorado Springs, CO (US)

(72) Inventors: Dennis L. Roark, Colorado Springs, CO (US); Robert S. Wolski, Colorado Springs, CO (US)

(73) Assignee: TERRA FERMA, LLC, Colorado Springs, CO (US)

( * ) Notice: Subject to any disclaimer, the term of this patent is extended or adjusted under 35 U.S.C. 154(b) by 330 days.

(21) Appl. No.: 17/354,623

(22) Filed: Jun. 22, 2021

(65) Prior Publication Data

US 2021/0400828 A1   Dec. 23, 2021

Related U.S. Application Data

(60) Provisional application No. 63/042,725, filed on Jun. 23, 2020.

(51) Int. Cl.
| | | |
|---|---|---|
| *H05K 5/02* | (2006.01) | |
| *H05K 7/20* | (2006.01) | |
| *H05K 7/14* | (2006.01) | |

(52) U.S. Cl.
CPC ......... *H05K 5/0217* (2013.01); *H05K 7/1432* (2013.01); *H05K 7/209* (2013.01); *H05K 7/2039* (2013.01)

(58) Field of Classification Search
CPC .. H05K 5/0217; H05K 7/1432; H05K 7/2039; H05K 7/209
See application file for complete search history.

(56) References Cited

U.S. PATENT DOCUMENTS

| | | | | |
|---|---|---|---|---|
| 3,593,064 A | * | 7/1971 | Wagner | H05K 7/023 361/730 |
| 5,438,162 A | | 8/1995 | Thompson | |
| 5,455,739 A | * | 10/1995 | Barden | H05K 7/20445 361/796 |
| 6,049,813 A | * | 4/2000 | Danielson | G06K 7/10881 714/E11.14 |
| 7,907,394 B2 | * | 3/2011 | Richardson | G06F 1/1613 361/679.02 |
| 8,031,464 B2 | | 10/2011 | Adkins | |
| 9,046,906 B1 | | 6/2015 | Faucett | |

(Continued)

*Primary Examiner* — Abhishek M Rathod
(74) *Attorney, Agent, or Firm* — Martensen IP; Michael C. Martensen

(57) ABSTRACT

A ruggedized programable switch accepts multiple forms of current from a plurality of sources and thereafter conditions and balances the current to provide a reliable common grounding plane of current for an end user. The common plane reduces electrical noise and interference through grounding loops preventing crosstalk between adjacent circuits while prioritizing current sources feeding the common plane. Components necessary to provide such a common plane of current are housed within a sealed, ruggedized protective housing. The housing passively conveys heat generated by the interiorly protected components to a plurality of heat dissipating fins and channels on the housing's exterior maintaining the device's operational capability. At the same time the housing protects the components from adverse environments and from adverse handling such as might be experienced in remote locations

18 Claims, 10 Drawing Sheets

(56) References Cited

U.S. PATENT DOCUMENTS

| | | | | |
|---|---|---|---|---|
| 9,511,491 | B2* | 12/2016 | Brunner | B25H 3/02 |
| 10,367,538 | B2* | 7/2019 | Lai | H04B 1/3888 |
| 10,413,028 | B2* | 9/2019 | Wang | G03B 17/14 |
| 10,575,417 | B2* | 2/2020 | Sabbag | H05K 5/03 |
| 10,779,444 | B2* | 9/2020 | Neuman | H05K 7/20854 |
| D903,685 | S* | 12/2020 | Wright | D14/440 |
| 11,006,536 | B2 | 5/2021 | Mcdowell | |
| D920,671 | S* | 6/2021 | Brunner | D3/294 |
| 2004/0042175 | A1 | 3/2004 | Kehret | |
| 2007/0041160 | A1 | 2/2007 | Kehret | |
| 2008/0137287 | A1 | 6/2008 | Mojaver | |
| 2014/0166516 | A1* | 6/2014 | Martinez | A45F 5/021 |
| | | | | 206/372 |
| 2018/0288907 | A1* | 10/2018 | Richards | H01L 23/36 |
| 2019/0044452 | A1* | 2/2019 | Arita | H02M 7/003 |
| 2020/0084900 | A1* | 3/2020 | McDowell | H05K 5/0247 |

\* cited by examiner

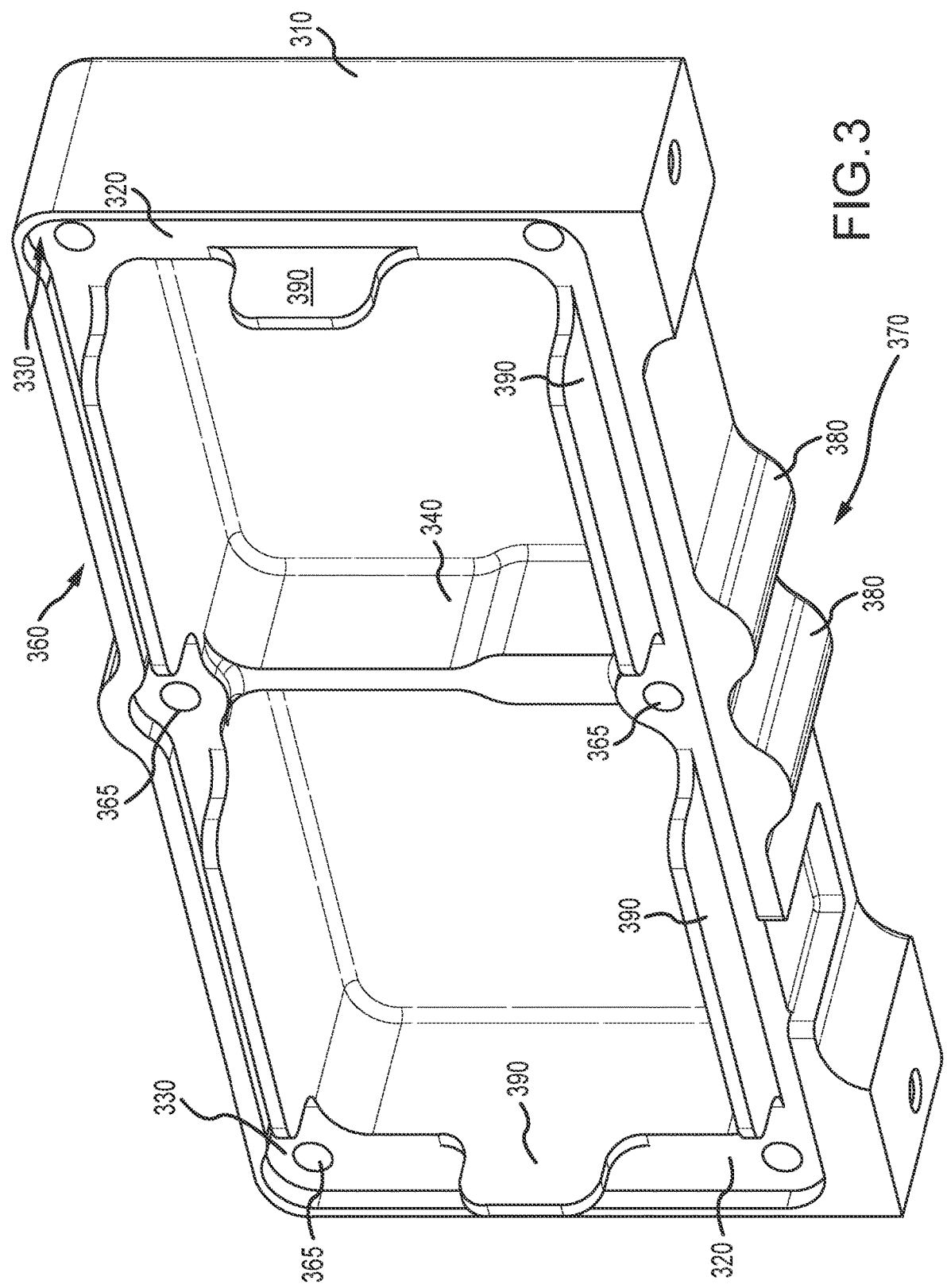

RUGGEDIZED PROGRAMMABLE POWER SWITCH

RELATED APPLICATION

The present application relates to and claims the benefit of priority to U.S. Provisional Patent Application No. 63/042,725 filed 23 Jun. 2020 which is hereby incorporated by reference in its entirety for all purposes as if fully set forth herein.

BACKGROUND OF THE INVENTION

Field of the Invention

Embodiments of the present invention relate, in general, to ruggedized housings of electronic components and more particularly to ruggedized programmable power switches.

Relevant Background

Direct Current ("DC") to direct current power (DC-to-DC) converters are power-processing circuits that typically are used to convert an unregulated input DC voltage to a regulated DC output voltage. Switched-mode DC-to-DC power converters typically include an inverter, a transformer having a primary winding coupled to the inverter, and a rectifying circuit coupled to a secondary winding of the transformer. The inverter typically includes a switching device, such as a field effect transistor (FET), that converts the DC input voltage to an alternating voltage, which is magnetically coupled from the primary winding of the transformer to the secondary winding.

A control circuit regulates conduction of the switching device. The rectifying circuit rectifies the alternating voltage on the secondary winding to generate a desired DC output voltage. In conventional current mode DC-to-DC converters, the duty cycle of the switching device of the converter is modulated by a negative feedback voltage loop to maintain the desired output voltage. The negative feedback loop ordinarily includes a voltage error amplifier that compares a signal indicative of the output voltage to a reference voltage.

In typical current mode control circuits, when the sum of the sensed transformer current and the compensating ramp from the voltage error amplifier exceed an error current signal, a latch is reset, and the switching device is turned OFF. To enhance power-processing density, or to meet increased current demands of the load, it is often desirous to connect several switch-mode converters in parallel. In a typical paralleled switch-mode converter configuration, each converter is designed to contribute an equal amount of current to the load in the presence of inevitable variations in reference voltages and component values.

A DC-to-DC power converter with multiple DC power sources typically source the DC power from one DC power source to another DC power source using a plurality of converter circuits. However, the energy drawn from each of the multiple DC power sources can vary greatly due to the load on the DC power converter circuit when the corresponding one of the multiple DC power sources is being utilized.

Multiple-input converters also have the capability to combine the advantages of different energy sources, such as photovoltaic cells, fuel cells, wind power devices, batteries, ultracapacitors and other renewable energy sources, with different voltage and current characteristics to provide power and for optimal energy/economic use while increasing the reliability of a system.

A common limitation of known multiple-input converters is that only one input power source is allowed to transfer energy into an output at a time to prevent power coupling effects. Known converters overcome the above limitation by utilizing a transformer with separate windings for each input. This type of converter can also accommodate multiple outputs by using multiple secondary windings. In this way, any input can provide energy to any output, and there is electrical isolation among all inputs and outputs. However, this type of converter requires a large transformer core to accommodate all of these windings, making the design cumbersome and costly.

The need for such a switch alleviating these needs is compounded with challenges presented by use in demanding environments. Participating in these various activities can expose such electronic devices to conditions such as rain, dirt, dust, mud, snow, and water (in all of its forms) that can be damaging to these electronic devices. Additionally, the typical housing that encases the components of these electronic devices is fragile or otherwise breakable and can be damaged by mistreatment and/or other inappropriate handling, such as by dropping. It is, therefore, useful to have a housing within which an electronic device, or the components thereof, in need of protection may be housed so as to protect it from inclement conditions, mistreatment, and/or inappropriate handling. Consequently, the housing of the actual electronic device itself may be ruggedized, or a separate housing designed to house the electronic device may be provided so as to protect the electronic device, or its components, from such damage.

The circumstance of ruggedizing a housing of the electronic device itself and/or providing a separate protective housing for the same is that it increases the size of the electronic device making transportation of the device more cumbersome. Accordingly, on one hand, providing environmental protection for such electronic devices allows them to be used in situations wherein the fear of breakage would otherwise prevent their use, however, such protection makes their transport more difficult and therefore decreases their usability. There is therefore a need in the art for a mechanism whereby such portable electronic devices are capable of being protected at the same time as being easily transported, stacked and used.

What is needed is a ruggedized programmable DC switch power supply capable of prioritizing multiple inputs, producing a common power plane. These and other deficiencies of the prior art are addressed by one or more embodiments of the present invention. Additional advantages and novel features of this invention shall be set forth in part in the description that follows, and in part will become apparent to those skilled in the art upon examination of the following specification or may be learned by the practice of the invention. The advantages of the invention may be realized and attained by means of the instrumentalities, combinations, compositions, and methods particularly pointed out in the appended claims.

SUMMARY OF THE INVENTION

The present invention provides a programmable Direct Current ("DC") switch power supply capable of prioritizing multiple inputs, producing a common power plane adjustable to specific averaging current power. The present invention receives and manages multiple power inputs in real time and prioritizes each to provide a consistent and reliable power output.

According to one embodiment of the present invention multiple power inputs are continuously monitored. At the moment there is any fluctuation or disruption in a primary power source, the invention will open up the next synchronized flood gate and let the next priority power supply provide all the power. Upon the power input of the primary source returning to normal the switch reprioritizes the power input selection, all while providing consistently reliable output power.

One embodiment of the present invention balances a direct current load across a multiple direct current power sources by receiving multiple direct current inputs to the inputs of a multiple input, single output DC-to-DC converter. The output current of each one of the direct current inputs is compared to a reference current. The direct current inputs are adjusted in corresponding DC-to-DC converter modules until the output current of each one of the direct current inputs is equal to the reference current. The adjusted output of the DC-to-DC converter modules are prioritized and/or combined to a single output current that can be output to supply the single output current to a load.

One embodiment of the present invention balances a direct current load across a multiple direct current power sources by receiving multiple direct current inputs to the inputs of a multiple input, single output DC-to-DC converter. The output current of each one of the direct current inputs is compared to a reference current. The direct current inputs are adjusted in corresponding DC-to-DC converter modules until the output current of each one of the direct current inputs is equal to the reference current. The adjusted output of the DC-to-DC converter modules are prioritized and/or combined to a single output current that can be output to supply the single output current to a load.

Another implementation provides a multiple direct current input, single direct current output converter system. The system includes multiple inputs corresponding to and coupled to multiple direct current input sources. Each of the multiple inputs is corresponding to end coupled multiple DC-to-DC converter/regulator modules. The system also includes an output current sharing and current limiting controller that is coupled by control lines to each of the DC-to-DC converter modules and a programmable controller. The output current sharing programmable controller includes a comparator for comparing an output current from each one of the DC-to-DC converter/regulator modules to a reference current and an adjusting circuit for determining a control signal for adjusting the output of each one of the DC-to-DC converter/regulator modules. The system also includes a combining module/regulator combining the outputs from each one of the DC-to-DC converter modules into a single output.

Another feature of the present invention is the ruggedized vessel in which programmable switch resides. One aspect of the invention is a system for protecting, retaining, and/or transporting an object, such as the programmable power switch described herein. In its most basic form, the container may be a sled or platform configured for retaining an electronic device and/or an electronic device that has been housed within a housing such as a ruggedized housing.

One embodiment of the present invention includes a platform incorporating an interior bridge by which a surrounding casing is supported. The resulting container is sealed to provide a watertight enclosure that is ruggedized and survivable in the worst of conditions all the while providing a grounding plane and heatsink affording normal operations for internal electronics.

One embodiment of the present invention is a ruggedized programmable power switch having a thermally conductive mounting platform mechanically and thermally coupled to an electronic layer. The electronic layer communicatively couples a plurality of electronic components. The switch of the present invention further includes a heat sink panel, on which a portion of the plurality of electronic components are affixed, mechanically coupled to the thermally conductive mounting platform.

The components are housed within a substantially tubular frame extruded from a heat conductive material having a first end and a second end. The tubular frame is configured as a heat sink having a plurality of exterior fins forming channels along a length of the tubular frame and includes an internal support centrally positioned between the first end and the second end. The internal support is in physical contact with the top interior surface of the tubular frame and the bottom surface of the substantially tubular frame. The thermally conductive mounting platform traverses and is in physical contact with the internal support.

The switch also includes a first endcap and a second endcap. Each endcap and endcap includes a plurality of interior facing extensions and channels. Each channel of each endcap is configured to accept an end of the tubular frame wherein the extensions are configured to mate with an interior surface of the tubular frame forming a ruggedized housing for the plurality of electronic components.

In other versions of the ruggedized programmable power switch of the present invention, the internal support includes a top portion, extending from the top interior surface of the tubular frame to the top surface of the mounting platform and a bottom portion, extending from a bottom surface of the mounting platform surface to the bottom interior surface of the tubular frame. The internal support is thermally conductive and configured to transfer heat from the mounting platform to the tubular frame and ultimately to the plurality of exterior fins. The frame can also include interior fins forming channels along its length.

The ruggedized programmable power switch of the present invention also includes a watertight gasket, interposed between the substantially tubular frame and each the first end cap and the second endcap isolating the electronic components housed withing from any exterior environments including moisture and dust.

Another aspect of the present invention is that the electronic components housed within the switch include a plurality of direct current switches coupled to two or more direct current sources, a processor and a non-transitory storage storing a set of instructions executable by the processor wherein the instructions prioritize direct current from the two or more of current sources producing a common power plane. In one instance the one or more direct current to direct current converters are configured to load balance current from the two or more current sources. The electronic components can also include a comparator for comparing an output current from each one or more direct current to direct current converters to a reference current.

The ruggedized programmable power switch of the present invention includes sealable input/output ports and meets Grade A of the United States Military's MIL-STD-810H specification for environmental engineering considerations. The switch of the present invention also meets United States Military's MIL-STD-461G specification for electromagnetic interference.

One embodiment of the present invention is configured to operate in an exterior environment with a temperature up to and including 65 degrees Celsius while another version can operate in an exterior environment with humidity ranging from 10% to 99%.

The features and advantages described in this disclosure and in the following detailed description are not all-inclusive. Many additional features and advantages will be apparent to one of ordinary skill in the relevant art in view of the drawings, specification, and claims hereof. Moreover, it should be noted that the language used in the specification has been principally selected for readability and instructional purposes and may not have been selected to delineate or circumscribe the inventive subject matter; reference to the claims is necessary to determine such inventive subject matter.

BRIEF DESCRIPTION OF THE DRAWINGS

The aforementioned and other features and objects of the present invention and the manner of attaining them will become more apparent, and the invention itself will be best understood, by reference to the following description of one or more embodiments taken in conjunction with the accompanying drawings, wherein:

FIG. 3 is a perspective view of the interior portion of an endcap that would mate to the tubular frame for a ruggedized programable power switch according to one embodiment of the present invention;

Figure 1:
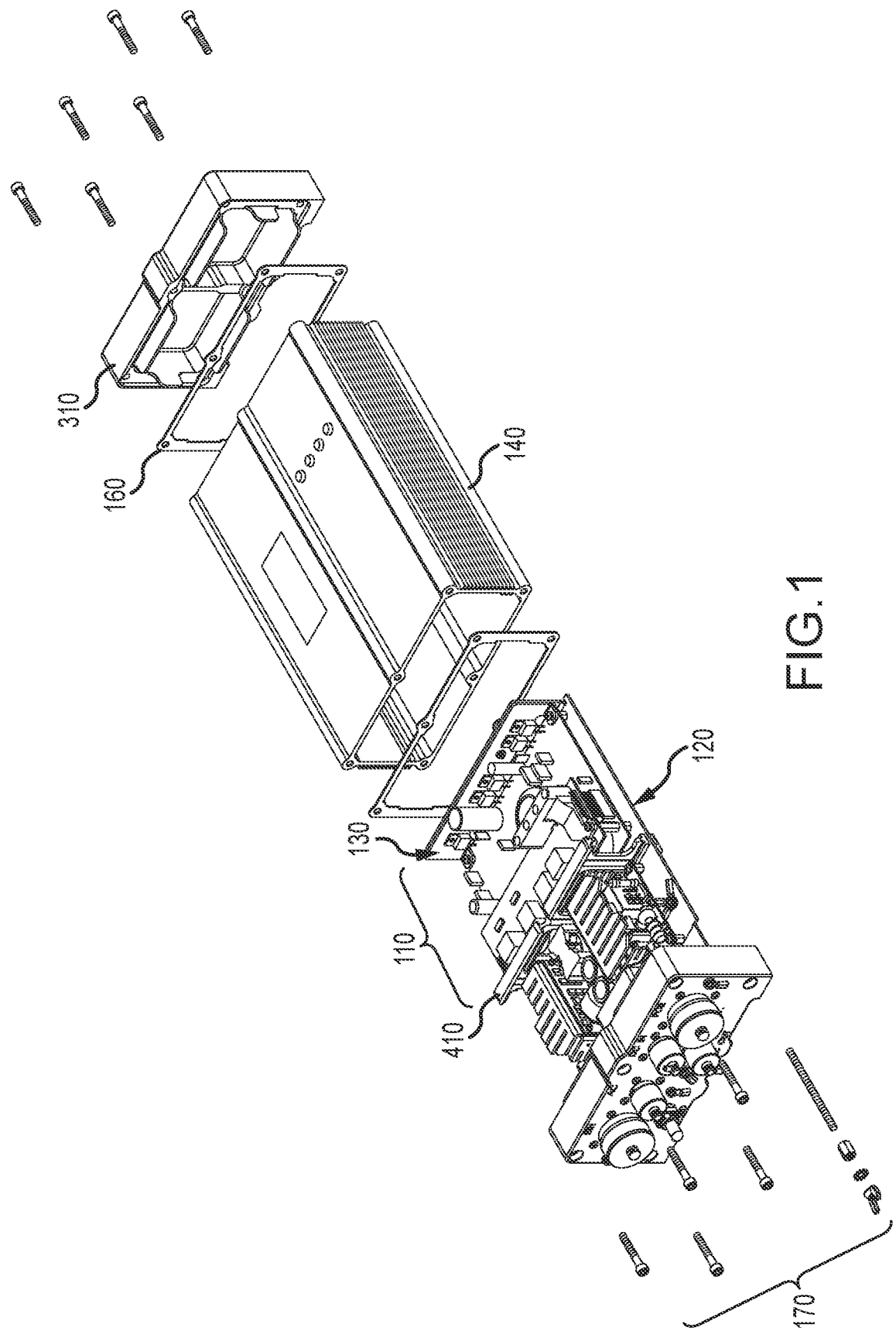
FIG. 1 presents an exploded perspective view of a ruggedized programable power switch according to one embodiment of the present invention.
Figure 2:
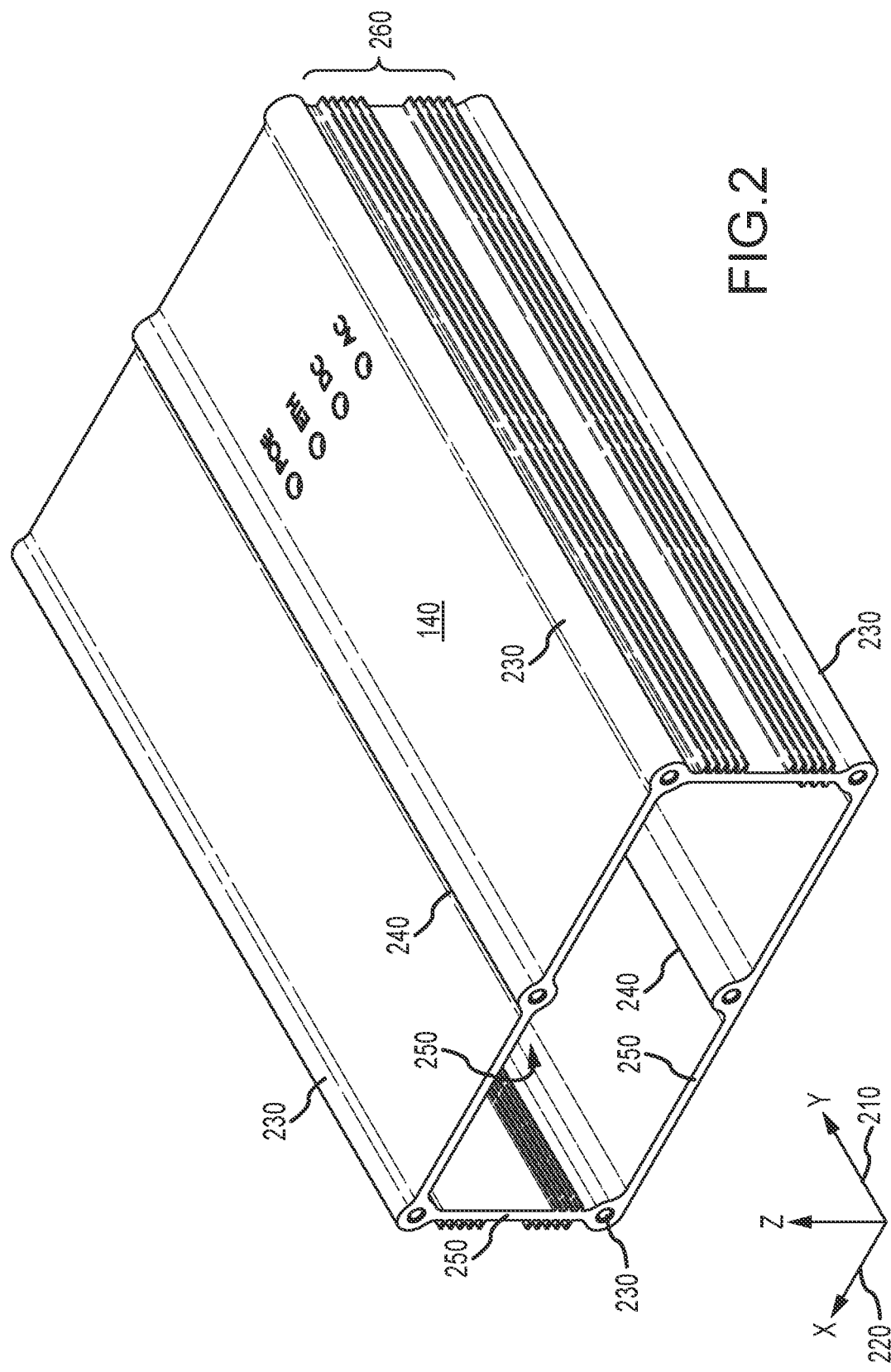
FIG. 2 is a perspective view of an extruded substantially tubular frame for a ruggedized programable power switch according to one embodiment of the present invention.
Figure 4A:
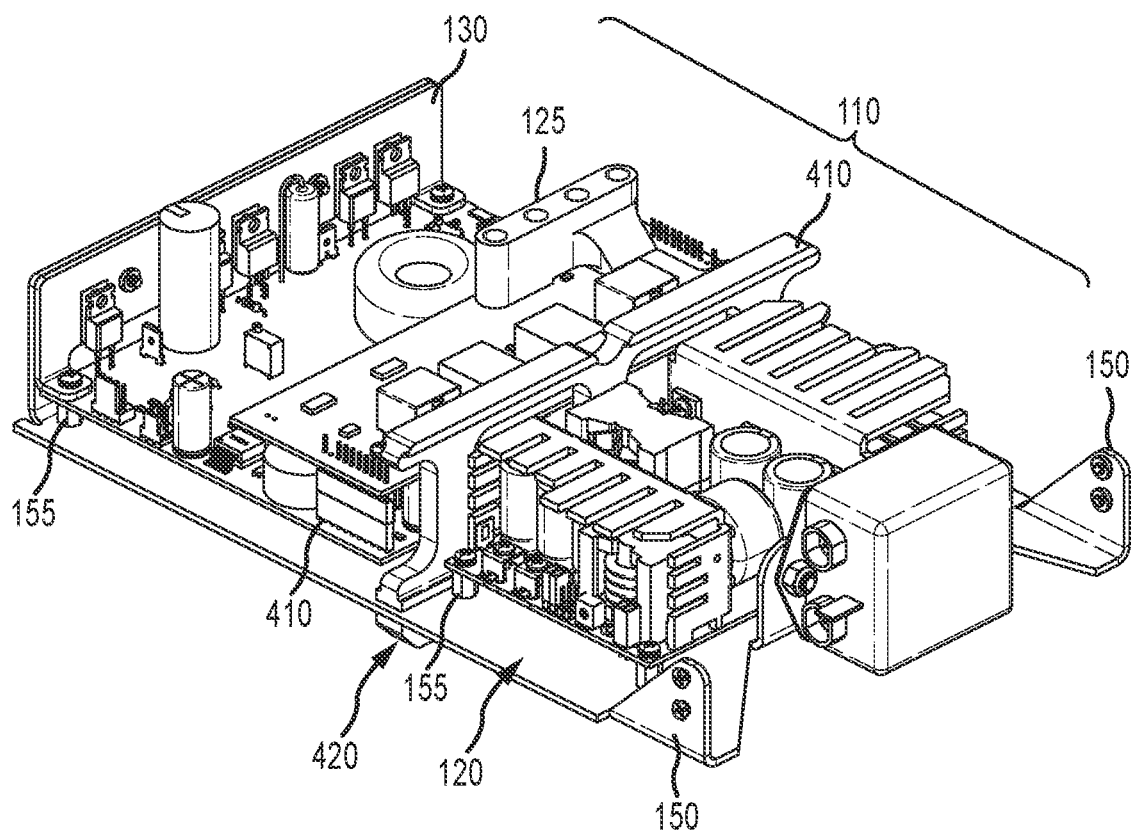
FIG. 4A is a top perspective view of a thermally conductive mounting platform, heat sink panel, internal support and a plurality of electronic components of a ruggedized programable power switch according to one embodiment of the present invention.
Figure 4B:
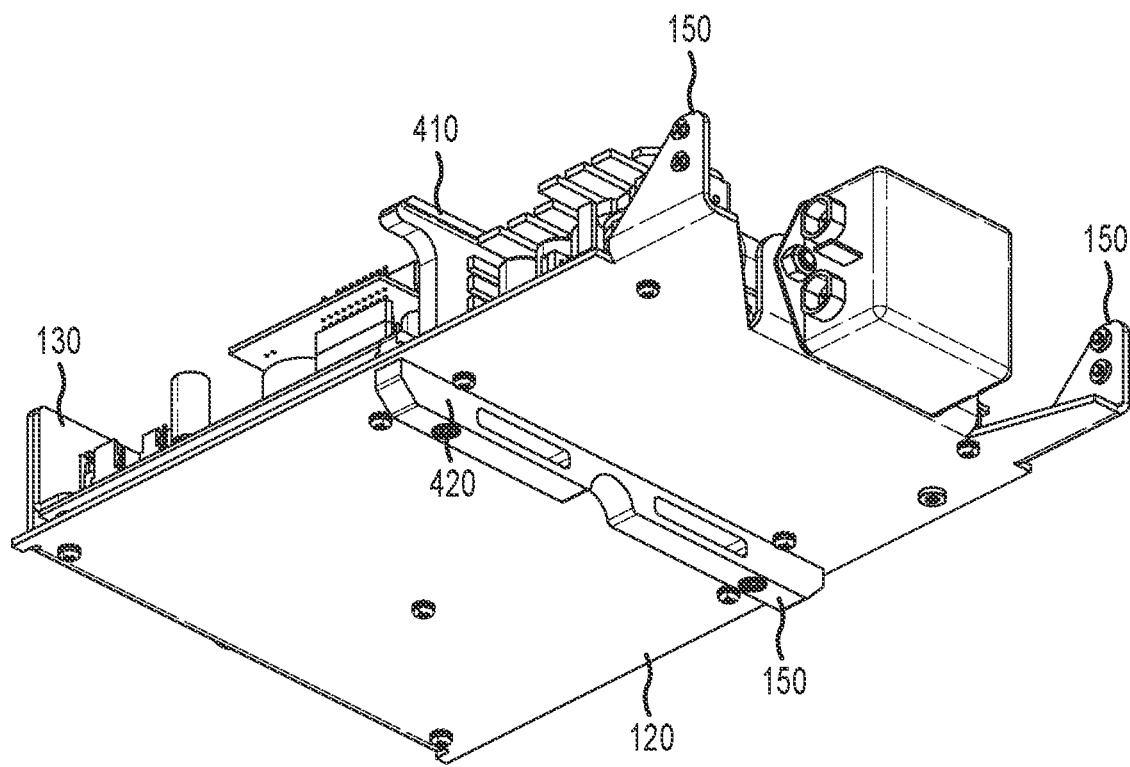
FIG. 4B is a bottom perspective view of the thermally conductive mounting platform of FIG. 4A, showing additional detail of the internal support for a ruggedized programable power switch according to one embodiment of the present invention.

The Figures depict embodiments of the present invention for purposes of illustration only. Like numbers refer to like elements throughout. In the figures, the sizes of certain lines, layers, components, elements or features may be exaggerated for clarity. One skilled in the art will readily recognize from the following discussion that alternative embodiments of the structures and methods illustrated herein may be employed without departing from the principles of the invention described herein.

DESCRIPTION OF THE INVENTION

A ruggedized programable switch accepts multiple forms of current from a plurality of sources and thereafter conditions and balances the current to provide a reliable common grounding plane of current for an end user. The common plane reduces electrical noise and interference through grounding loops preventing crosstalk between adjacent circuits. Components necessary to provide such a common plane of current are housed within a sealed, ruggedized protective housing. The housing passively conveys heat generated by the interiorly protected components to a plurality of heat dissipating fins and channels on the housing's exterior maintaining its operational capability. At the same time, the housing protects the components from adverse environments and from adverse handling such as might be experienced in remote locations.

Embodiments of the present invention are hereafter described in detail with reference to the accompanying Figures. Although the invention has been described and illustrated with a certain degree of particularity, it is understood that the present disclosure has been made only by way of example and that numerous changes in the combination and arrangement of parts can be resorted to by those skilled in the art without departing from the spirit and scope of the invention.

The following description with reference to the accompanying drawings is provided to assist in a comprehensive understanding of exemplary embodiments of the present invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The terms and words used in the following description and claims are not limited to the bibliographical meanings but are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

The terminology used herein is for the purpose of describing particular embodiments only and is not intended to be limiting of the invention. As used herein, the singular forms "a," "an" and "the" are intended to include the plural forms as well, unless the context clearly indicates otherwise. Thus, for example, reference to "a component surface" includes reference to one or more of such surfaces.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

It will be also understood that when an element is referred to as being "on," "attached" to, "connected" to, "coupled" with, "contacting", "mounted" etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under," "below," "lower," "over," "upper" and the like, may be used herein for ease of description to describe one element or feature's relationship to another element(s) or feature(s) as illustrated in the figures. It will be understood that the spatially relative terms are intended to encompass different orientations of a device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of "over" and "under". The device may be otherwise oriented (rotated 90 degrees or at other orientations) and the spatially relative descriptors used herein interpreted accordingly. Similarly, the terms "upwardly," "downwardly," "vertical," "horizontal" and the like are used herein for the purpose of explanation only unless specifically indicated otherwise.

For the purpose of the present invention the following terms are understood to mean the following.

What is meant by thermal conductivity is a measure of a material's ability to conduct heat. It is commonly denoted by k, λ, or κ. Heat transfer occurs at a lower rate in materials of low thermal conductivity than in materials of high thermal conductivity. For instance, metals typically have high thermal conductivity and are very efficient at conducting heat, while the opposite is true for insulating materials like Styrofoam. Correspondingly, materials of high thermal conductivity are widely used in heat sink applications, and materials of low thermal conductivity are used as thermal insulation.

What is meant by a heat sink is a passive heat exchanger that transfers the heat generated by an electronic or a mechanical device to a fluid medium, often air or a liquid coolant, where it is dissipated away from the device, thereby allowing regulation of the device's temperature. In electronics, heat sinks are used to cool components and some chipsets. A heat sink is designed to maximize its surface area in contact with the cooling medium surrounding it, such as the air. Air velocity, choice of material, protrusion design and surface treatment are factors that affect the performance of a heat sink. Heat sink attachment methods and thermal interface materials also affect the die temperature of the electronic component. Thermal adhesive or thermal paste improve the heat sink's performance by filling air gaps between the heat sink and the heat spreader on the device. A heat sink is usually made out of aluminum or copper.

What is meant by ruggedized is a device designed or improved to be hard-wearing or shock-resistant. Ruggedized devices are designed to operate reliably in harsh usage environments and conditions, such as strong vibrations, extreme temperatures and wet or dusty conditions. They are designed from inception for the type of rough use typified by these conditions, not just in the external housing but in the internal components and cooling arrangements as well.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

Included in the description are flowcharts depicting examples of the methodology which may be used provide a reliable plane of direct current through a ruggedized wide area network programmable power switch. In the following description, it will be understood that each block of the flowchart illustrations, and combinations of blocks in the flowchart illustrations, can be implemented by computer program instructions. These computer program instructions may be loaded onto a computer or other programmable apparatus to produce a machine such that the instructions that execute on the computer or other programmable apparatus create means for implementing the functions specified in the flowchart block or blocks. These computer program instructions may also be stored in a computer-readable memory that can direct a computer or other programmable apparatus to function in a particular manner such that the instructions stored in the computer-readable memory produce an article of manufacture including instruction means that implement the function specified in the flowchart block or blocks. The computer program instructions may also be loaded onto a computer or other programmable apparatus to cause a series of operational steps to be performed in the computer or on the other programmable apparatus to produce a computer implemented process such that the instructions that execute on the computer or other programmable apparatus provide steps for implementing the functions specified in the flowchart block or blocks.

Accordingly, blocks of the flowchart illustrations support combinations of means for performing the specified functions and combinations of steps for performing the specified functions. It will also be understood that each block of the flowchart illustrations, and combinations of blocks in the flowchart illustrations, can be implemented by special purpose hardware-based computer systems that perform the specified functions or steps, or combinations of special purpose hardware and computer instructions.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

In a preferred embodiment, one or more portions of the present invention can be implemented in software. Software programming code which embodies the present invention is typically accessed by a microprocessor from long-term, persistent storage media of some type, such as a flash drive or hard drive. The software programming code may be embodied on any of a variety of known media for use with a data processing system, such as a diskette, hard drive, CD-ROM, firmware, or the like. The code may be distributed on such media or may be distributed from the memory or storage of one computer system over a network of some type to other computer systems for use by such other systems. Alternatively, the programming code may be embodied in the memory of the device and accessed by a microprocessor using an internal bus. The techniques and methods for embodying software programming code in memory, on physical media, and/or distributing software code via networks are well known and will not be further discussed herein.

Operating in an austere environment is a challenge. Operating electronics in austere environments is even more daunting. Field operations centers are often quickly deployed, established and then shortly, thereafter, dismantled and moved. Electronic components used in such environments must reliably operate in the worsts of conditions. Such components must be substantially sealed from moisture as well as from dust/dirt/contaminants while survivable to shock and compressive forces that would normally render any normal electronic component useless.

The same environments rarely have reliable power. While power may be gained from solar, wind, generators or a local electrical grid, the characteristics, frequency, voltage, amperage, etc. are often erratic and unreliable. Yet the successful operation of electronic components in such deployed locations is critical to mission success. Embodiments of the present invention house and protect programmable power switches while normalizing and prioritizing a variety of power sources.

Embodiments of the present invention include protective protrusions, extensions, supports, mounts, and shunts that allow electronic components to operate in a safe, sealed environment. The housing is, in one embodiment, ruggedized to meet Grade A of the United States Military's MIL-STD-810H specification for environmental engineering considerations as well as MIL-STD-461G specification for electromagnetic interference. Moreover, the device can operate in temperatures at least as low as −20 degrees Celsius and at least as high as 65 degrees Celsius. And while subject to these temperatures the switch can reliably operate in an exterior environment with humidity ranging from 10% to 99%. Indeed the device, for all practical purposes can reside in a puddle of water while being subjected to the full weight of a vehicle and still continue to operate. And while these environments are challenging, a hot, dry scenario is also contemplated as the device includes the means to capture and channel heat generated by the electronic components to the exterior surface for transfer to the local environment.

FIGS. 1-4 show a ruggedized wide area network programmable switch in various forms of disassembly/assembly. In one embodiment the present invention, one or more electronic layers 110 are mechanically coupled to a thermally conductive mounting plate 120. Included within the electronic layers 110 are a variety of electronic components. One such component is a monolithic Light Emitting Diode (LED) Manifold 125 that provides a multiplicity of individual light transmission from the internal PCBA mounted Light Emitting Diodes. When combined with proprietary LED Lenses, these light transmission pathways provide for a ruggedized, water-tight external display through transparent portions of the frame of the individual status messages for monitoring the operation of the ruggedized device.

The components are attached to the plate via metal standoffs and screws 155. The mounting plate 120 is further coupled to a heat sink panel 130 housing electronic components that, during operations, generate significant amounts of thermal energy. Heat generated by these (and other) components is captured by the heat sink panel 130 and conveyed to the thermally conductive mounting panel 120 and thereafter the exterior frame 140. In some versions of the present invention components include a thermally conductive pad interposed between the component and the mounting plate. Power supply components includes auxiliary heat sinks directly attached to the mounting plate 120 conducting heat away from the component. Heat transfer pads attached to the flanges of the mounting plate conduct heat away from the source to the mounting points.

Heat generated by other electronic components coupled to the thermally conductive mounting panel 120 is a combined with energy captured by the heat sink panel 130 and other mechanisms) and transferred to a substantially tubular/rectangular frame 140 via the several mounting points 150. The substantially tubular/rectangular frame 140 is, in one embodiment, unitarily extruded from a thermally conductive material such as aluminum or the like. In other embodiments the frame can be cast or forged or constructed of several individual components and joined forming the frame. While the extruded frame is thermally conductive, it is also formed in a shape to withstand significant compressive forces once assembled. One of reasonable skill in the relevant art will appreciate that the cross-sectional shape of the frame may vary to accommodate differing internal requirements while not departing from the scope of the present invention. In a preferred embodiment the cross-sectional shape of the frame is substantially rectangular with a major axis 210 being approximately 2-3 times that of the minor axis 220. Other symmetrical shapes and geometries are contemplated while retaining the novel features of the examples presented herein.

Each corner of the extrusion (frame 140) includes, in one embodiment, a protrusion 230 adding significant rigidity and strength. Each protrusion 230, which is substantially thicker than the upper/lower or side panels, runs the length of the frame, extending equally from the planer surfaces into the interior region as well as the outer surfaces. Beyond adding strength and protection, the protrusions 230 create a space between the outer panel and any surfaces on which the device may rest enabling heat transfer from the internal electronic components to the external environment. The protrusion 230 can be further shaped to facilitate mounting the device in an equipment rack or stacking several on top of each other while retaining air space between the units for heat transfer. Shock mounts, tie downs, handles and other components can be added to the exterior to aid in deployment and transportability.

In addition to protrusions 230 positioned at each of the corners of the rectangular frame, a central protrusion 240 running the longitudinal length of the larger panel upper and lower surfaces of the frame forms a pseudo-I-beam structure transferring compressive forces to vertical support structures resident in the side panels and endcaps as well as to a centrally positioned internal support.

A first and second endcap 310 are joined to the substantially tubular frame 140 at each end forming the housing and providing compressive strength and rigidity. Each endcap 310 includes a channel 320 configured to accept and mate with the end face 250 of the frame. The protrusions 230, 240 resident on the frame are captured within receptacles 330 on each endcap providing vertical support for the frame. Each endcap further includes a central column 340 which runs from the top to the bottom internal surface providing vertical support mid span of each endcap.

In one embodiment the endcap upper 360 and lower 370 surfaces are complimentary asymmetrical. An upper outcropping captures the central upper perturbation 240 of the fame while the remainder of the upper surface of the endcap remains essentially flat. The lower surface of each endcap includes a plurality of outcroppings. Two central outcroppings 380 flank the lower central frame perturbance 240 with an additional outcropping positioned at each lower corner of the endcap. When the devices are stacked, the upper outcroppings of a lower positioned device mate with the lower surfaces and outcroppings of an upper device. Additional recesses and pin combinations are incorporated to secure stacked devices from lateral and longitudinal movement.

Attachment points 365 on each endcap are aligned with each frame perturbance 230, 240. Bolts or similar connective means traverse the endcap into a threaded cavity in the frame. A gasket 160 interposed between each endcap and the frame provides a water-tight seal upon tightening the bolts mating each endcap 310 mating to the frame 140.

In addition to the recessed channel 320 in each endcap 310 that accept and mates with the end face of the frame, each endcap includes a plurality of extensions 390 or fins. Each extension 390 includes a planar surface configured to mate with a corresponding interior surface of the frame. The extensions increase surface contact and load transfer between the endcaps and the frame while maintaining the integrity of the frame perturbances.

Sealable access ports 170 for the internally housed electronic components 110 are positioned on at least one end cap. The access ports include points of contact for importing a plurality of DC power sources and a variety of points for accessing the common DC power plane.

An internal support 410, 420 is centrally positioned between the ends of the frame 140/endcaps 310. The internal support 410, 420 extends from and is in physical contact with an interior upper surface of the frame 140 to the frame's interior bottom surface. In one embodiment the interior support 410, 420 includes a central column connecting the upper frame surface with the lower frame surface. One aspect of the internal frame is an upper portion 410 and a lower portion 420 bisected by the thermally conductive mounting platform 120. In this version of the invention the upper portion 410 of the interior support extends from the upper interior surface of the frame 140 to the upper surface of the mounting platform 120. Immediately below and aligned with the upper portion 410 of the interior support, a lower portion 420 of the interior support extends from the lower surface of the mounting platform 120 to the lower interior surface of the fame 140. The upper portion 410, lower portion 420 and the interposed section of the mounting platform 120 form a unitary support structure spanning from the upper interior surface of the frame to the lower interior surface of the frame.

The internal support 410, 420 further includes a left and right lateral support column proximate to the side panels of the frame. As with the central column, each side column includes an upper portion extending from the upper interior surface of the frame to the upper surface of the mounting platform and a lower portion extending from the lower surface of the mounting platform to the lower surface of the frame, forming a support. The upper portion 410, lower portion 420 and the interposed section of the mounting platform 120 form unitary support structures spanning from the upper interior surface of the frame to the lower interior surface of the frame. These three columns transfer compressive loads midspan of the frame to the endcaps via the longitudinal perturbances.

In addition to adding structural strength, the internal support 410, 420 is thermally conductive. Heat transferred from the electronic components 110 to the mounting platform 120 is conveyed to the frame 140 via the internal support 410, 420 and other points of contact between the mounting platform 120 and the frame 140.

In addition to these heat transfer points, in other embodiments, the switch/frame can include a plurality of heat pipes. In such a version of the invention the heat pipes can be in thermal contact with the top/bottom panels and/or with the side panels of the frame. In other embodiments, the system can include one or more heat sinks, with or without thermal communication to any heat pipes. The heat sinks can be integral and/or monolithic components of the panels and/or frame, and the heat sinks can be located on the inside and/or the outside of the chassis. In a preferred embodiment, each DC-to-DC converter includes heat pipes, which can combine thermal conductivity to release heat produced by the converters. The high temperature end of the heat pipes can be positioned so as to be in thermal contact with the DC-to-DC converters. The low temperature end of the heat pipes can be positioned so as to be in thermal contact with a side of the frame. Heat pipes and/or heat sinks can obviate the need for fans or other electronics cooling systems which can decrease the size, weight, and power requirements of the switch.

The frame 140, in one embodiment includes a plurality of cooling fins 260. Cooling fins 260, forming channels, enable passive cooling of the electronic components housed within the device. Passive cooling utilizes natural conduction, convection, and radiation to cool the electronic components retained within the housing. The frame an endcaps 310 act as heat sinks for internally generated heat. A plurality of fins 260 running the length on the exterior and/or interior the frame enable heat to be passively transferred to the environment. In one embodiment the fins 260 are positioned on the side panels of the frame 140 so as to not interfere with stacking or mounting of the housing in a rack. In other embodiments the fins are located on the upper and lower panels yet do not extend beyond the endcap outcroppings.

The present invention provides a programmable switch power supply capable of prioritizing multiple inputs, producing a common power plane adjustable to specific averaging current power. The present invention receives and manages multiple power inputs in real time and prioritizes each to provide a consistent and reliable power output.

Figure 5:
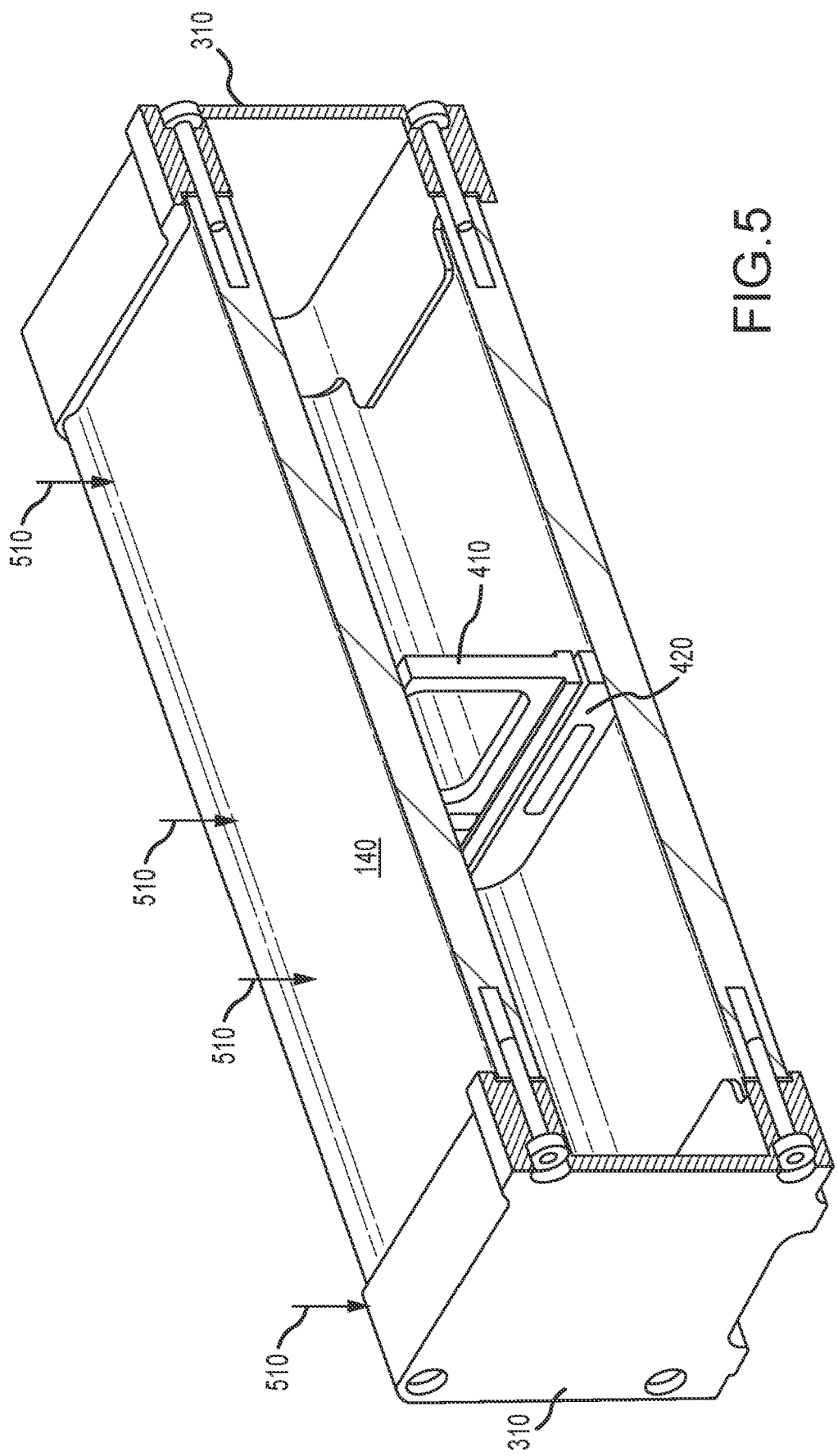
FIG. 5 is a cut away top perspective view of one version of the ruggedized programable power switch of the present invention showing compressive force distributions points.

FIG. 5 presents a side cutaway perspective view of the ruggedized power switch of the present invention under compressive load analysis. The frame 140 and endcaps 310 are presented with compressive forces 510 which are experienced at the point of contact and at a traverse position on the lower surface/contact point. The cutaway also illustrates the supportive nature of the internal support 410, 420 which prevents the upper surface of the frame 140 from catastrophic deformation. The compressive forces are translated from the upper surface of the frame 140, through the internal support 410, 420 to the lower surface without deforming or impacting the operation of the electronic components, coupled to the mounting platform (not shown).

According to one embodiment of the present invention multiple power inputs are continuously monitored. At the moment there is any fluctuation or disruption in a primary power source, the invention opens the next synchronized flood gate and lets the next priority power supply provide power. Upon the power input of the primary source returning to normal the switch reprioritizes the power input selection, while providing consistently reliable output power.

One embodiment of the present invention balances a direct current load across a multiple direct current power sources by receiving multiple direct current inputs to the inputs of a multiple input, single output DC-to-DC converter. The output current of each one of the direct current inputs is compared to a reference current. The direct current inputs are adjusted in corresponding DC-to-DC converter modules until the output current of each one of the direct current inputs is equal to the reference current. The adjusted output of the DC-to-DC converter modules are prioritized and/or combined to a single output current that can be output to supply the single output current to a load.

A direct current load is balanced across a multiple direct current power sources in another version of the invention by receiving multiple direct current inputs to the inputs of a multiple input, single output DC-to-DC converter. The output current of each one of the direct current inputs is compared to a reference current. The direct current inputs are adjusted in corresponding DC-to-DC converter modules until the output current of each one of the direct current inputs is equal to the reference current. The adjusted output of the DC-to-DC converter modules are prioritized and/or combined to a single output current that can be output to supply the single output current to a load.

Another implementation provides a multiple direct current input, single direct current output converter system. The system includes multiple inputs corresponding to and coupled to multiple direct current input sources. Each of the multiple inputs is correspondingly end coupled to multiple DC-to-DC converter/regulator modules. The system also includes an output current sharing and current limiting controller that is coupled by control lines to each of the DC-to-DC converter modules and a programmable controller. The output current sharing programmable controller includes a comparator for comparing an output current from each one of the DC-to-DC converter/regulator modules to a reference current and an adjusting circuit for determining a control signal for adjusting the output of each one of the DC-to-DC converter/regulator modules. A combining module/regulator combines the outputs from each one of the DC-to-DC converter modules into a single output.

Figure 6:
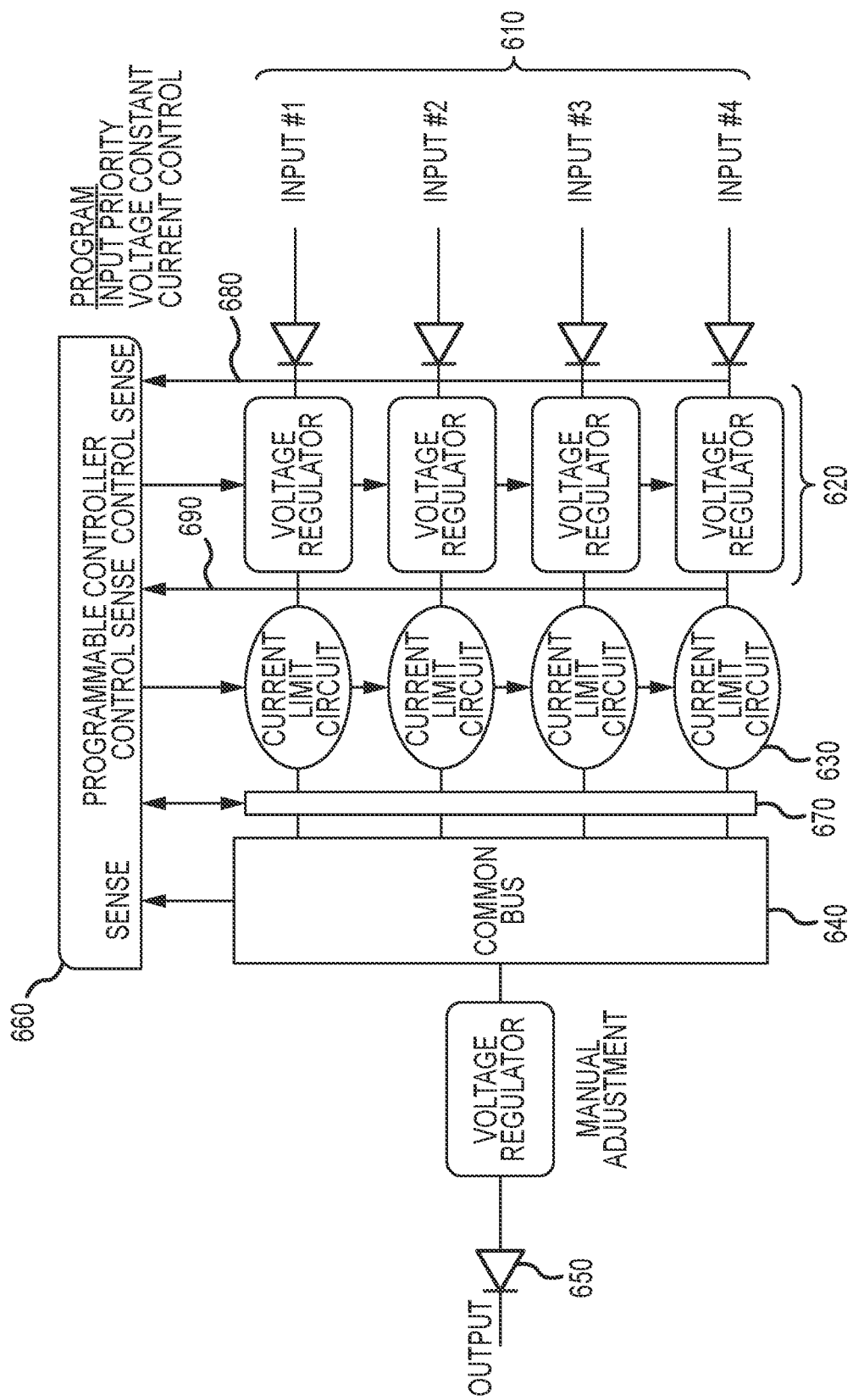
FIG. 6 is high level system diagram for one embodiment of a ruggedized programable power switch of the present invention.

FIG. 6 presents a multiple input, single output DC-to-DC power converter system according to the present invention. Each of the multiple DC power sources 610 include corresponding, individual converter circuits 620 and a corresponding isolation circuit 630 having an input coupled to the output of each of the individual converter circuits. The individual converter circuits 620 convert the DC voltage output from the corresponding DC source to a selected DC output voltage 640. The present invention provides a constant reliable output power from a plurality of input sources. As long as one of the plurality of input power sources provides sufficient current, the output voltage, current and power can be regulated, balanced and reliably delivered.

The multiple input, single output 650 DC-to-DC power converter system includes multiple inputs 610 coupled to the output of each one of a corresponding multiple DC power sources. A converter circuit combines the power provided by the multiple DC power sources to produce a single DC power output that is coupled to a load.

In one embodiment a converter circuit includes an output current sharing controller 660, a corresponding DC-to-DC converter modules 620 coupled to each one of the multiple inputs 610 and a combining module 670. The output current sharing controller 660 includes a signal line coupled to a corresponding control signal input, e.g., a feedback input 680, for each one of the DC-to-DC converter modules.

Figure 7A:
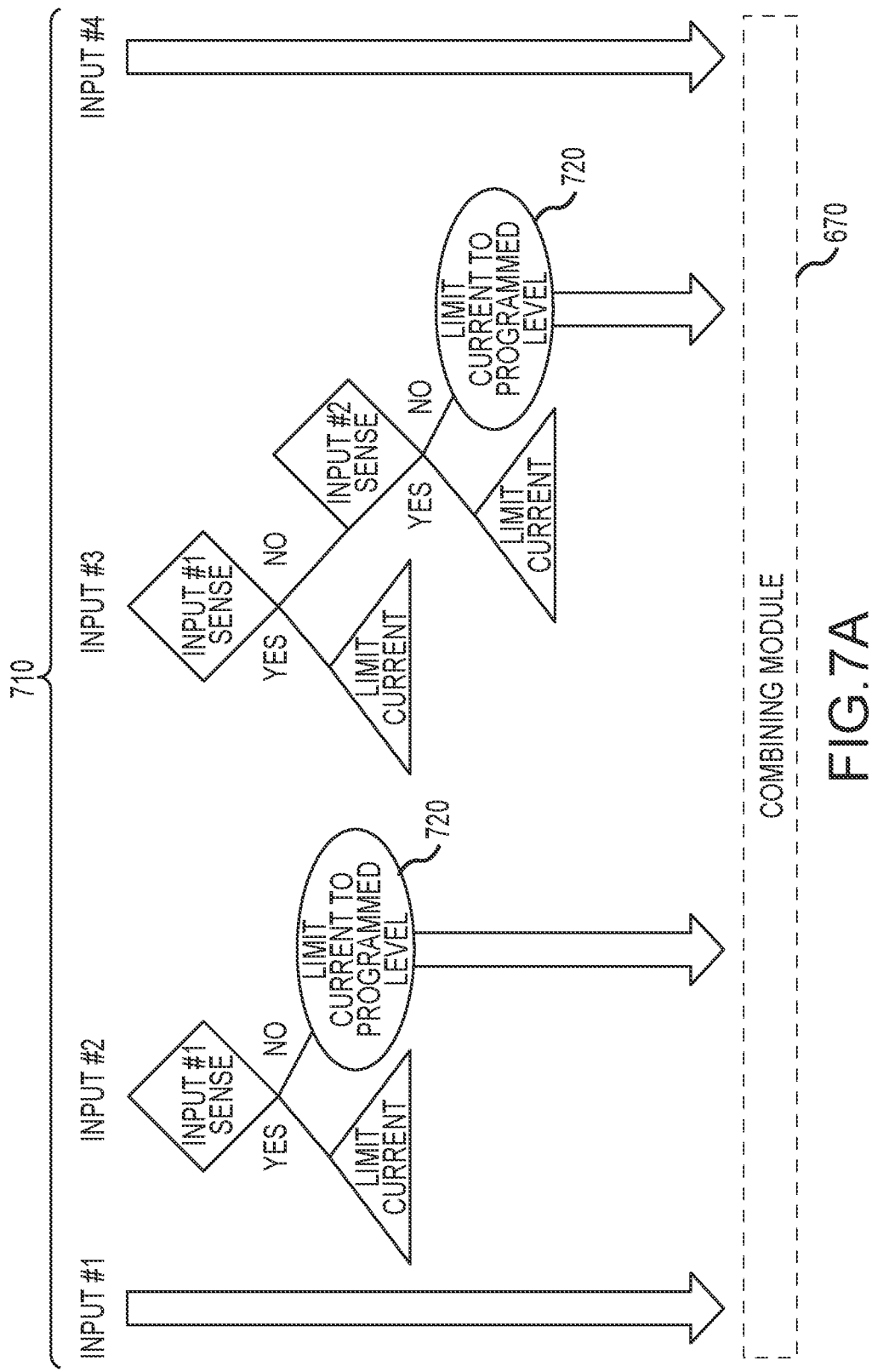
FIG. 7A is a functional flow diagram for current prioritization of a ruggedized programable power switch of the present invention.
Figure 7B:
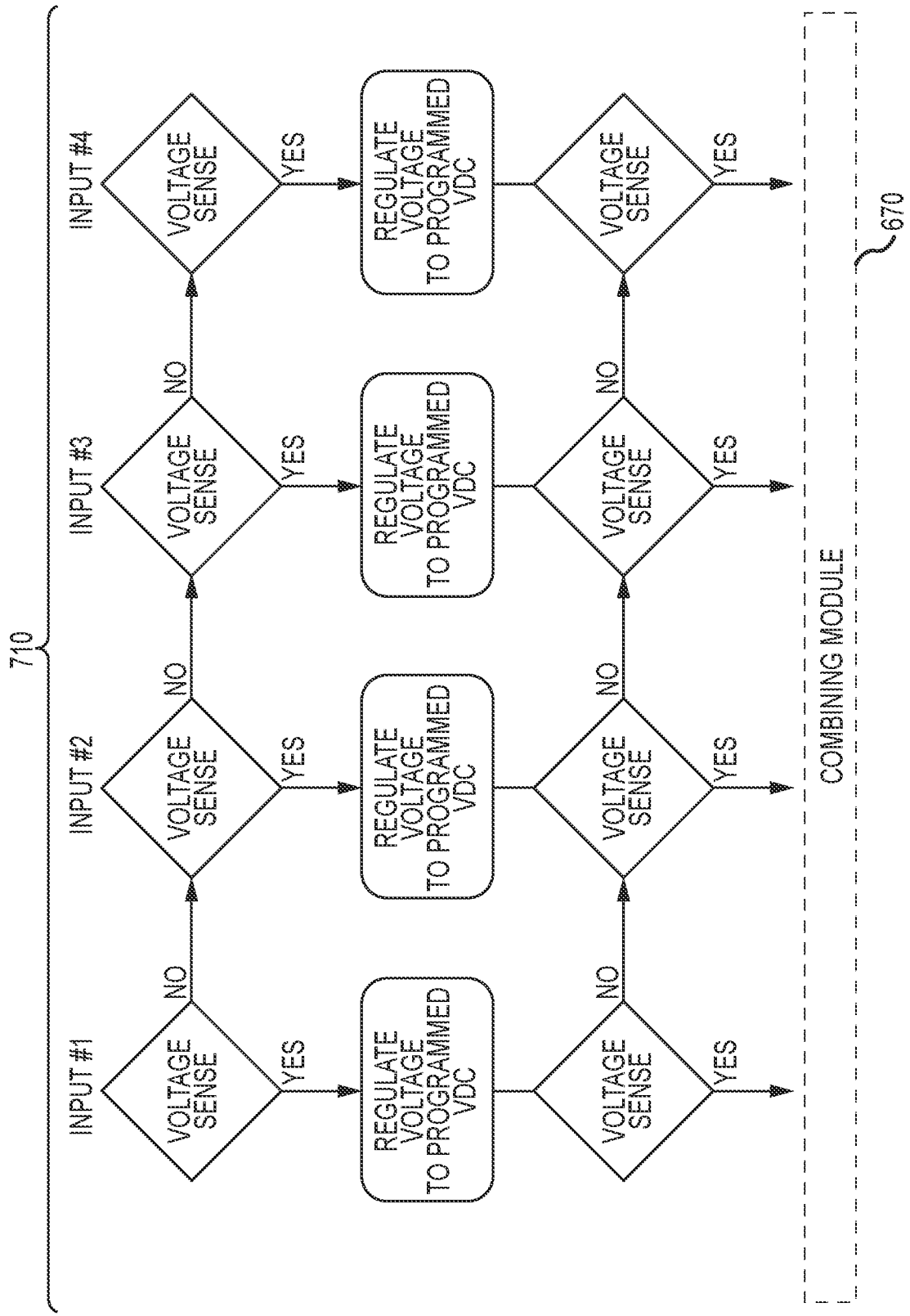
FIG. 7B is a block diagram showing components and processes for current prioritization of a ruggedized programable power switch of the present invention.
Figure 8:
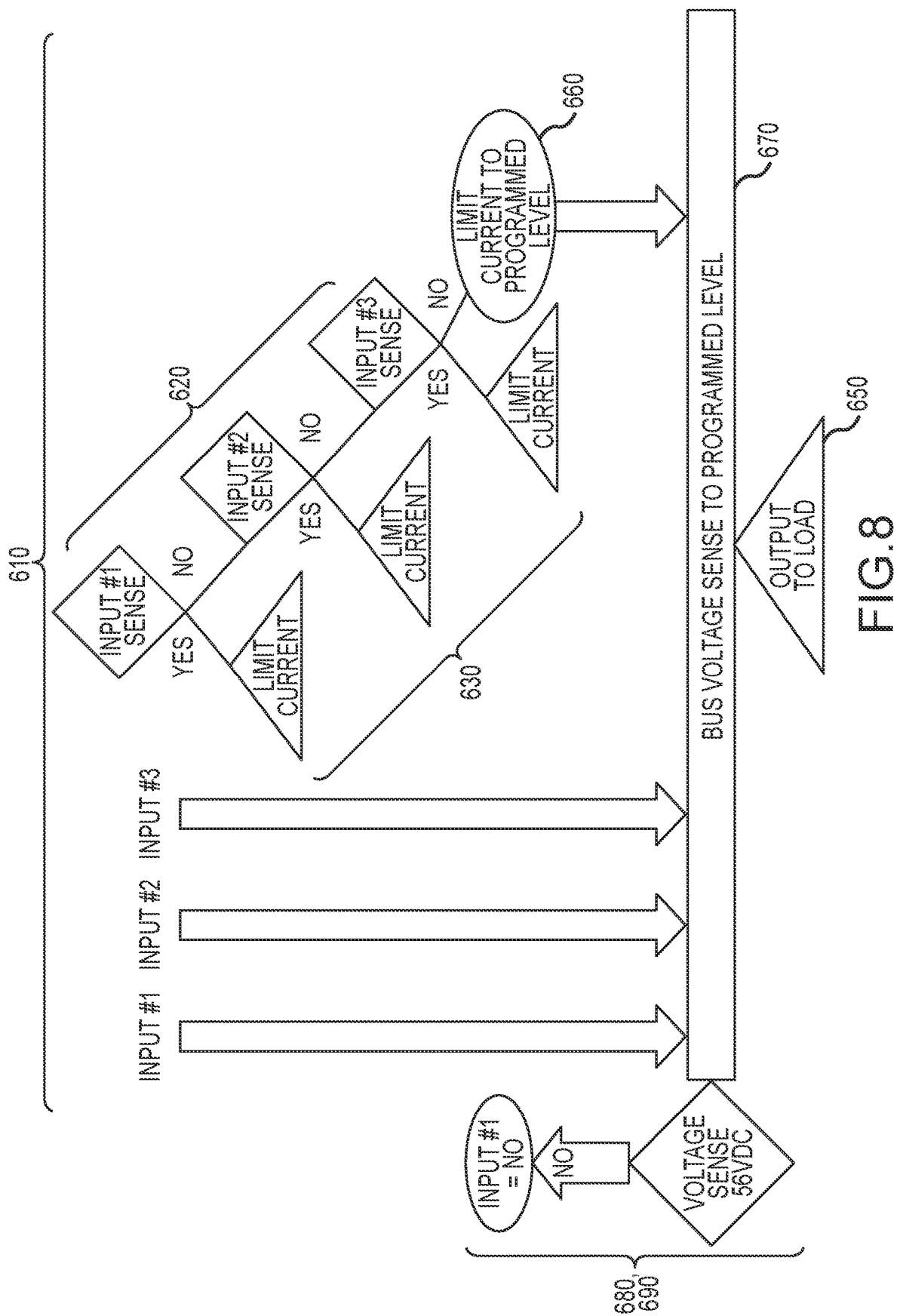
FIG. 8 is a block diagram of a system for ruggedized programmable power switch encoding to one embodiment of the present invention.

With additional reference to FIGS. 7A and 7B, the current sharing controller also includes a comparator for comparing output current from each one of the DC-to-DC converter modules. Each of the DC-to-DC converter modules receive the respective input DC voltage and current from the corresponding DC power sources and currents 720 the input DC voltage and current to a selected output DC voltage and current. The DC-to-DC converter modules also provide corresponding monitoring signals to the output current sharing controller via the corresponding signal line 690. In one implementation, the signal lines can be combined in a single signal line between all of the DC-to-DC converter modules and the output sharing controller. Alternatively, the signal lines can be individual a single signal lines between each one of the DC-to-DC converter modules and the output sharing controller. The combining module 670 includes multiple inputs corresponding to each one of the outputs of the DC-to-DC converter modules. The combining module has a single output corresponding to the output node of the converter circuit One version of the present invention is programmed to accept a high power Alternating Current source and prioritize it as the most reliable power source. Input power with lower DC voltage is assigned a secondary or tertiary priority as appropriate. Power sources could be from a local power grid, solar cells, wind power or the like. The power supply can be programmed to provide a constant DC voltage. In once instant the output voltage is programmed to be 56.0 VDC while in another version the output voltage is 36.0 VDC. Despite this output voltage the switch can accept any source at any level of power to arrive at the desired output.

For example a user can couple to the switch of the present invention power lead from a local power grid providing AC power as well as a power generator and a 28 VDC battery system. The invention is programed to provide a minimum of 28 VDC but will prioritize the AC power provided off the local grid and/or generator before drawing power from the batteries. The common power plane continuously regulates all power sources to provide the desired, programmed, output power. The system does not switch to different power sources, but more accurately regulates and mixes power to a common plane with priority. Reverse polarity and foldback voltage/current protection are incorporated into the system for integrity and protection.

As will be understood by those familiar with the art, the invention may be embodied in other specific forms without departing from the spirit or essential characteristics thereof. Likewise, the particular naming and division of the modules, managers, functions, systems, engines, layers, features, attributes, methodologies, and other aspects are not mandatory or significant, and the mechanisms that implement the invention or its features may have different names, divisions, and/or formats. Furthermore, as will be apparent to one of ordinary skill in the relevant art, the modules, managers, functions, systems, engines, layers, features, attributes, methodologies, and other aspects of the invention can be implemented as software, hardware, firmware, or any combination of the three. Of course, wherever a component of the present invention is implemented as software, the component can be implemented as a script, as a standalone program, as part of a larger program, as a plurality of separate scripts and/or programs, as a statically or dynamically linked library, as a kernel loadable module, as a device driver, and/or in every and any other way known now or in the future to those of skill in the art of computer programming. Additionally, the present invention is in no way limited to implementation in any specific programming language, or for any specific operating system or environment. Accordingly, the disclosure of the present invention is intended to be illustrative, but not limiting, of the scope of the invention, which is set forth in the following claims.

While there have been described above the principles of the present invention in conjunction with a ruggedized DC-to-DC switch, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features that are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The Applicant hereby reserves the right to formulate new claims to such features and/or combinations of such features during the prosecution of the present application or of any further application derived therefrom.

What is claimed is:

1. A ruggedized programmable power switch, comprising:
   a thermally conductive mounting platform;
   an electronic layer communicatively coupling a plurality of electronic components wherein the electronic layer is mechanically coupled to the thermally conductive mounting platform;
   a heat sink panel, on which a portion of the plurality of electronic components are affixed, mechanically coupled to the thermally conductive mounting platform;
   a substantially tubular frame extruded from a heat conductive material having a first end and a second end wherein the substantially tubular frame is configured as a heat sink having a plurality of exterior fins forming channels along a length of the tubular frame;
   an internal support centrally positioned between the first end and the second end of the substantially tubular frame and extending from, and in physical contact with, a top interior surface of the substantially tubular frame to a bottom surface of the substantially tubular frame and wherein the thermally conductive mounting platform traverses and is in physical contact with the internal support; and
   a first endcap and a second endcap wherein each the first endcap and the second endcap include a plurality of interior facing extensions and a channel, wherein the channel is configured to accept the first end of the substantially tubular frame and the second end of the tubular frame, respectively, and wherein each of the plurality of interior facing extensions are configured to mate with an interior surface of the tubular frame forming a ruggedized housing for the plurality of electronic components.

2. The ruggedized programmable power switch of claim 1, wherein the internal support includes a top portion extending from the top interior surface of the substantially tubular frame to a top thermally conductive mounting platform surface and a bottom portion extending from a bottom thermally conductive mounting platform surface to the bottom interior surface of the substantially tubular frame.

3. The ruggedized programmable power switch of claim 1, wherein the internal support is thermally conductive and configured to transfer heat from the thermally conductive mounting platform to the substantially tubular frame and the plurality of exterior fins.

4. The ruggedized programmable power switch of claim 1, further comprising a watertight gasket, interposed between the substantially tubular frame and each the first end cap and the second endcap configured to isolate the plurality of electronic components from an exterior environment including moisture and dust.

5. The ruggedized programmable power switch of claim 1, wherein the substantially tubular frame includes a plurality of interior fins forming channels along the length of the tubular frame.

6. The ruggedized programmable power switch of claim 1, wherein the plurality of electronic components include a plurality of direct current switches coupled to two or more current sources, a processor and a non-transitory storage storing a set of instructions executable by the processor wherein the instructions prioritize direct current from the two or more of current sources producing a common power plane.

7. The ruggedized programmable power switch of claim 6, wherein the plurality of electronic components includes one or more direct current to direct current converters configured to load balance current from the two or more current sources.

8. The ruggedized programmable power switch of claim 7, wherein the plurality of output components includes a comparator for comparing an output current from each one or more direct current to direct current converters to a reference current.

9. The ruggedized programmable power switch of claim 1, further comprising a plurality of sealable input/output ports.

10. The ruggedized programmable power switch of claim 1, wherein the ruggedized housing meets Grade A of the United States Military's MIL-STD-810H specification for environmental engineering considerations.

11. The ruggedized programmable power switch of claim 1, wherein the ruggedized housing meets United States Military's MIL-STD-461G specification for electromagnetic interference.

12. The ruggedized programmable power switch of claim 1, wherein the plurality of electronic components within the ruggedized housing is configured to operate in an exterior environment with a temperature up to and including 65 degrees Celsius.

13. The ruggedized programmable power switch of claim 1, wherein the plurality of electronic components within the ruggedized housing is configured to operate in an exterior environment with humidity ranging from 10% to 99%.

14. The ruggedized programmable power switch of claim 1, further comprising a sealable computer interface connection configured to communicate with one or more of the plurality of electronic components.

15. The ruggedized programmable power switch of claim 1, further comprising a plurality of thermal shunts configured to transfer heat from one or more of the plurality of electronic components to the thermally conductive mounting platform.

16. A method comprising:
  providing a ruggedized programmable power switch including:
    a thermally conductive mounting platform;
    an electronic layer communicatively coupling a plurality of electronic components wherein the electronic layer is mechanically coupled to the thermally conductive mounting platform;
    a heat sink panel, on which a portion of the plurality of electronic components are affixed, mechanically coupled to the thermally conductive mounting platform;
    a substantially tubular frame extruded from a heat conductive material having a first end and a second end wherein the substantially tubular frame is configured as a heat sink having a plurality of exterior fins forming channels along a length of the tubular frame;
    an internal support centrally positioned between the first end and the second end of the substantially tubular frame and extending from, and in physical contact with, a top interior surface of the substantially tubular frame to a bottom surface of the substantially tubular frame and wherein the thermally conductive mounting platform traverses and is in physical contact with the internal support; and
    a first endcap and a second endcap wherein each the first endcap and the second endcap include a plurality of interior facing extensions and a channel, wherein the channel is configured to accept the first end of the substantially tubular frame and the second end of the tubular frame, respectively, and wherein each of the plurality of interior facing extensions are configured to mate with an interior surface of the tubular frame; and
  configuring the ruggedized programmable power switch providing constant output power based on a plurality of input power sources in an exterior environment with temperatures between −20 degrees Celsius and 65 degrees Celsius.

17. The method of claim 16, further comprising configuring the ruggedized wide area network programmable power switch to operate in an exterior environment with humidity ranging from 10% to 99%.

18. The method of claim 16, wherein at least one of the plurality of electronic components is thermally coupled to the substantially tubular frame.

* * * * *